United States Patent [19]

Misic et al.

[11] Patent Number: 4,731,584

[45] Date of Patent: Mar. 15, 1988

[54] MAGNETIC RESONANCE PROBE FOR OPERATION AT FREQUENCIES ABOVE SELF RESONANCE

[75] Inventors: George J. Misic, Novelty; John L. Patrick, Solon, both of Ohio

[73] Assignee: Picker International, Inc., Highland Hts., Ohio

[21] Appl. No.: 897,046

[22] Filed: Aug. 14, 1986

Related U.S. Application Data

[63] Continuation-in-part of Ser. No. 765,708, Aug. 14, 1985, and a continuation-in-part of Ser. No. 641,570, Aug. 16, 1984, Pat. No. 4,634,980.

[51] Int. Cl.[4] .................................... G01R 33/20
[52] U.S. Cl. .................................. 324/318; 324/322
[58] Field of Search ............. 324/300, 307, 318, 322, 324/311; 343/742, 744, 748; 333/32

[56] References Cited

U.S. PATENT DOCUMENTS

| | | | |
|---|---|---|---|
| 4,052,661 | 10/1977 | Higham et al. | 324/0.5 R |
| 4,563,579 | 1/1986 | Kellerhals et al. | 250/291 |
| 4,590,947 | 5/1986 | Krause | 128/653 |
| 4,594,566 | 6/1986 | Maudsley | 333/219 |
| 4,607,225 | 8/1986 | Crooks | 324/318 |
| 4,638,253 | 1/1987 | Jaskolski et al. | 324/311 |

OTHER PUBLICATIONS

Colligiani, A., et al., "Low Impedance ENDOR Spectrometer", Journal of Magnetic Resonance, vol. 33, No. 3, Mar. 1979, pp. 511–518.
"Quadrature Detection Coils-A Further $\sqrt{2}$ Improvement in Sensitivity" by Chen, et al., J. of Mag. Res. 54, pp. 324–327, (1983).
"The NMR Receiver: A Description and Analysis of Design" by D. I. Hoult; Pro. in NMR Spectroscopy, vol. 12, pp. 41, 64–65 (1968).

*Primary Examiner*—Stewart J. Levy
*Assistant Examiner*—Kevin D. O'Shea
*Attorney, Agent, or Firm*—Fay, Sharpe, Beall, Fagan, Minnich & McKee

[57] ABSTRACT

A magnetic field control (A) causes a magnetic field through an imaging region of a magnetic resonance spectrometer. A radio frequency generator (20) generates radio frequency signals which are transmitted on a transmission line (22) to a probe coil (C). Magnetic resonance signals received by the probe coil (C) are conveyed over the transmission line to a radio frequency receiver (24) for reconstruction into a magnetic resonance image. An inductive matching network (D) is connected between the probe coil and the transmission line for matching the resistive impedance of the coil with the resistive impedance of the transmission line and for resonating the coil at a frequency other than its self resonance frequency. When the probe coil is operated above the self resonance frequency, it is capacitively reactive. An inductor (40) is connected across coil feed points (30, 32) of the probe coil. The inductive reactance of the matching inductor is selected such that the capacitive reactance of the probe coil at a selected frequency above the self resonance frequency is cancelled.

19 Claims, 8 Drawing Figures

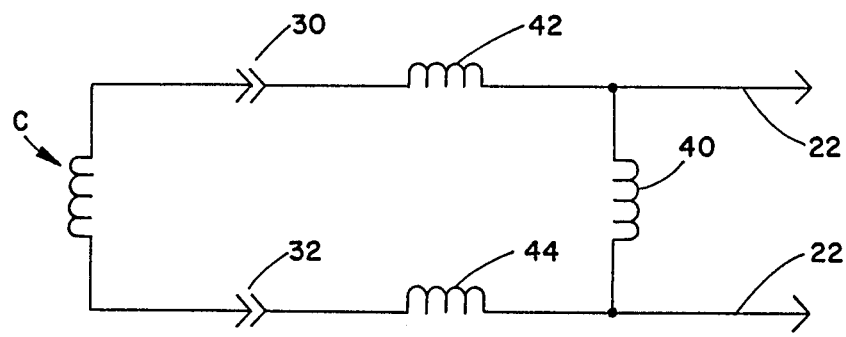
F I G. 2
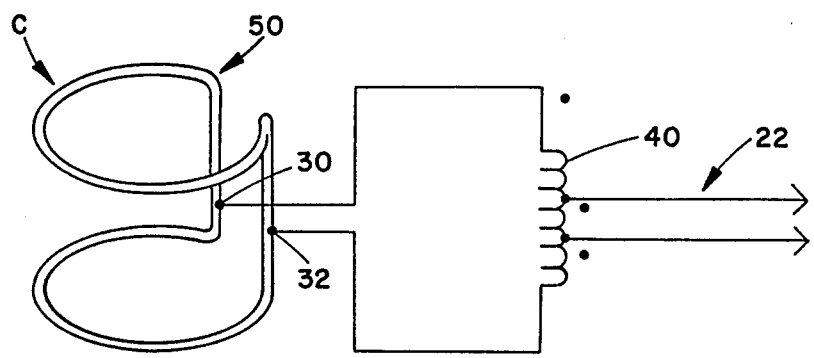
F I G. 3
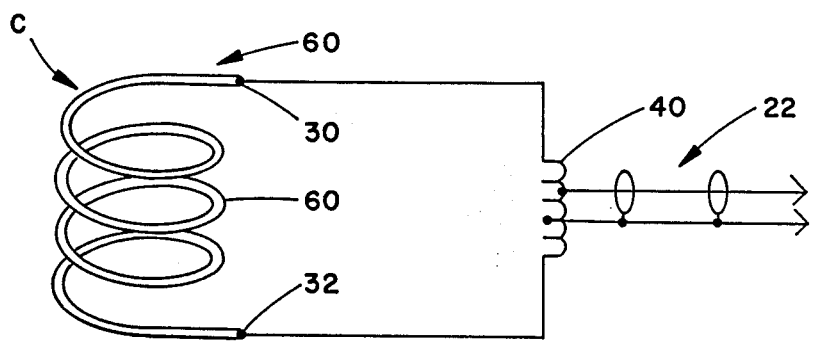
F I G. 4

MAGNETIC RESONANCE PROBE FOR OPERATION AT FREQUENCIES ABOVE SELF RESONANCE

This application is a continuation-in-part of application Ser. No. 765,708, filed Aug. 14, 1985 and a continuation-in-part of application Ser. No. 641,570 filed Aug. 16, 1984 now U.S. Pat. No. 4,634,980.

BACKGROUND OF THE INVENTION

The present application pertains to the art of magnetic resonance spectroscopy. More particularly, the present invention relates to the operation of magnetic resonance and other radio frequency probes above self resonance. Although the present invention finds application in the field of medical magnetic resonance imaging, it is to be appreciated that the invention may also find utility in conjunction with other types of magnetic resonance spectroscopy, other nuclear and electron resonance techniques, and other high radio frequency transmission applications.

Heretofore, magnetic resonance imaging apparatus have included a radio frequency resonator coil for inducing magnetic resonance in a region of the body of interest. When performing proton magnetic resonance imaging in the range of 1.0–2.0 Tesla and above, a corresponding operating resonance frequency of 40–90 and above megahertz was required.

The self resonance frequency of Helmholtz pair coils and saddle coils varies as a function of several factors, including diameter. When Helmholtz pair and saddle coils are configured in a sufficiently large diameter to receive a human torso therein, their self resonance point or parallel resonant frequency was well below 40 megahertz. One approach for achieving higher resonance frequencies was to use other resonator designs, particularly resonator designs which incorporated relatively large expanses of thin metal foil. See for example U.S. Pat. No. 3,783,419 issued Jan. 1, 1974 to Lafond, et al. Lumped and distributed capacitance techniques were also utilized to raise the self resonance frequency of coils and probes.

These prior art higher frequency coil or probe arrangements had several disadvantages. First, the current path through metal foil resonators was difficult to control. Eddy currents and other current irregularities destroyed RF homogeneity of the resonator assembly. Further, the inherent eddy current paths prevented the use of crossed coil or quadrature probes, because orthogonal placement was insufficient to reduce or eliminate the induced eddy currents. Further, the resonators were not amenable to tuning for operation over a wide frequency range, rather, the low inductance inherent in most resonator designs adversely affected their utility at low frequencies.

The lumped or distributed capacitance designs also had several disadvantages. First, the placement of capacitors about the coil structure prevented the coil from being resonated by conventional means below the series resonant point of the capacitors and linked coil inductance. That is, when the frequency was shifted sufficiently that the magnitude of the capacitive reactance exceeded that of the inductive reactance, the coil structure as a whole became capacitively reactive. Moreover, in larger structures, the series resonant point began to approach the self parallel resonant point. This required holding the operating range of the coil between the limits of the series and parallel resonance. Moreover, the peformance of the coil tended to become erratic. For example, small changes in parameters caused by sample loading variations were magnified.

The present invention contemplates a new and improved magnetic resonance probe assembly which permits radio frequency pickup coil systems to operate at frequencies above their natural self resonant frequencies.

SUMMARY OF THE INVENTION

In accordance with one aspect of the present invention, a magnetic resonance spectrometer is provided. A probe which has a self resonance frequency above which it is capacitively reactive and below which it is inductively reactive. A magnetic field means is provided for selectively generating a magnetic field adjacent the probe. A radio frequency transmission line which has a resistive impedance conveys the magnetic resonance signals from the probe to a radio frequency receiver. An inductive matching network which is operatively connected between the probe and the transmission line matches the reactive and resistive impedance of the probe with the resistive impedance of the transmission line. The matching network has a net inductive reactance when the probe is used at frequencies above self resonance.

In accordance with another aspect of the present invention, a magnetic resonance probe assembly is provided which operates at frequencies above the natural self resonance frequency thereof. A probe coil, which has first and second feed points, has a self resonance frequency above which it appears at the feed points to be capacitively reactive and below which it appears to be inductively reactive. An impedance matching network is operatively connected with the first and second feed points. The matching network is configured with a reactance which is selected to cancel an imaginary portion of the reactance of the probe coil and matching network at a preselected resonance frequency other than the self resonance frequency.

In accordance with a more limited aspect of the invention, the matching network includes an inductor means connected between the feed points such that the preselected resonance frequency is above the self resonance frequency.

In accordance with yet another aspect of the present invention, a method is provided for receiving magnetic resonance signals at a frequency above a self resonance frequency of a receiving coil. Above the self resonance frequency, the coil is capacitively reactive. The coil is positioned in a magnetic field to receive signals at the magnetic resonance frequency from a subject therein. An inductive reactance is connected across the coil. The inductive reactance is selected to cancel the capacitive reactance of the coil at the magnetic resonance frequency.

A primary advantage of the present invention is that it provides greater flexibility in coil design. The construction of crossed coil and quadrature coil systems is facilitated.

Another advantage of the present invention is that it provides a greater probe sensitivity.

Yet another advantage resides in improved RF field homogeneity.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts and various steps and arrangements of steps. The drawings are only for purposes of illustrating a preferred embodiment of the invention and are not to be construed as limiting it.

FIG. 2 is a detailed circuit illustration of the matching network of FIG. 1;

FIG. 3 is an alternate embodiment of the coil and matching network and probe coil of FIG. 1;

FIG. 4 is another alternate embodiment of the matching network and probe coil;

DETAILED DESCRIPTION OF THE PREFERRED EMBODIMENTS

Figure 1:
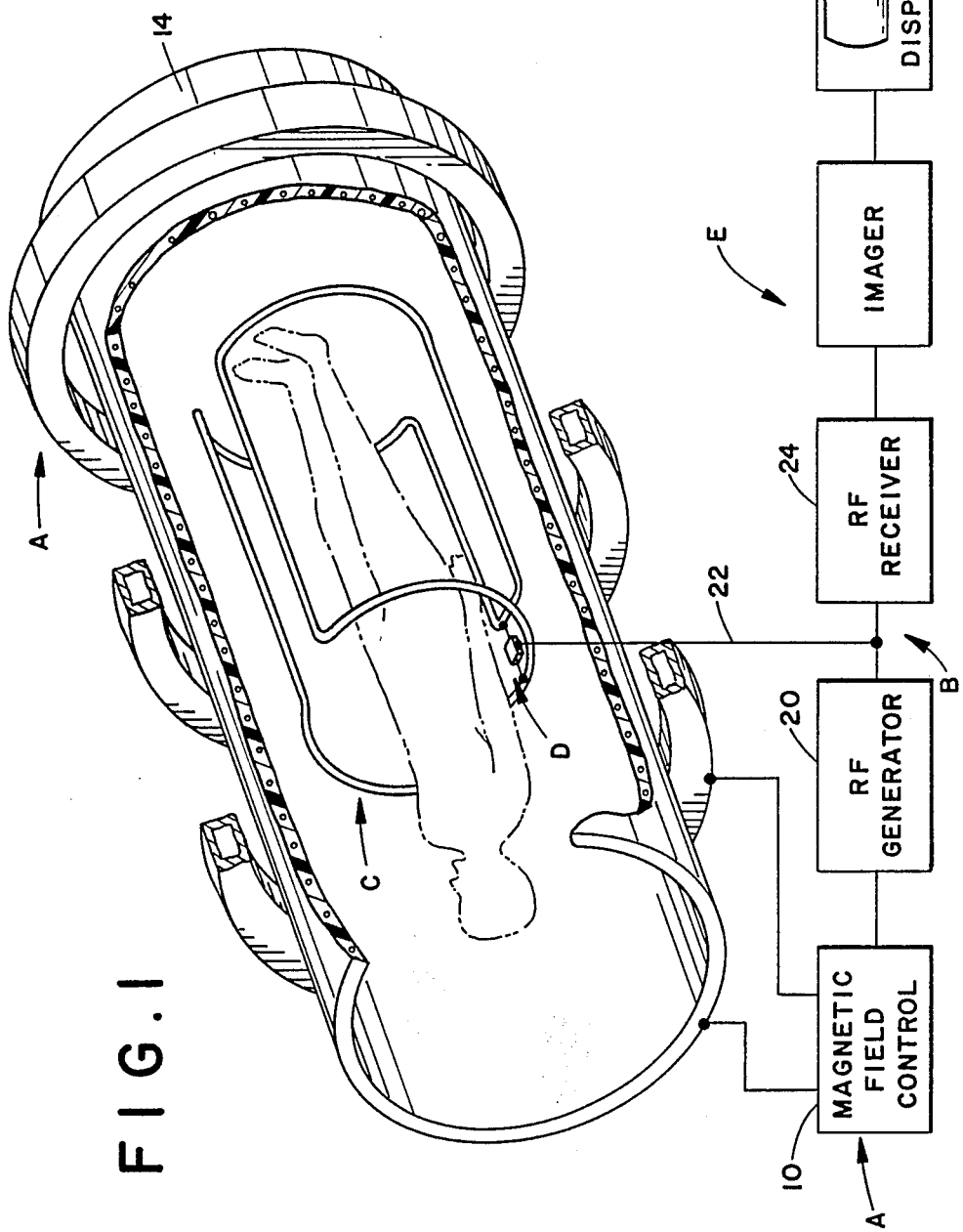
FIG. 1 is a diagrammatic illustration of a magnetic resonance imaging system in accordance with the present invention.

With reference to FIG. 1, a magnetic field generating means A generates a polarizing magnetic field longitudinally through a subject or image region. The magnetic field may include gradients for providing slice selection, phase encoding, spatial encoding, and the like. A radio frequency transmission and reception means B transmits and receives radio frequency signals from a radio frequency probe coil assembly C. The transmitted radio frequency signals selectively excite magnetic resonance of hydrogen or other dipoles in the image region which generate resonance signals. The probe coil assembly C has an inherent self resonance frequency above which it appears as a capacitive reactance and below which it appears as an inductive reactance. A matching network D (1) matches resistive impedance between the coil and with the interconnection with the transmitter and receiver means and (2) cancels capacitive reactance at a selected frequency other than the self resonance frequency. An image reconstruction means E applies Fourier transform or other image reconstruction techniques to the received radio frequency signals to generate electronic image representations for display or to be recorded in memory or on tape.

The magnetic field control means A includes a magnetic field control circuit 10 which controls the current flow through main magnetic field coils 12 for generating a substantially uniform main magnetic field longitudinally through the image region. The magnetic field control circuit 10 further controls a gradient coil 14 which selectively causes magnetic field gradients across the main magnetic field. The gradients perform slice selection, read direction selection, phase encoding, and other conventional functions in magnetic resonance imaging.

The radio frequency transmission reception means B includes a radio frequency generator 20 which generates magnetic resonance excitation pulses, inversion pulses, and other radio frequency pulses as are conventional in the art. A coaxial transmission line 22 conveys the radio frequency excitation signals from the radio frequency generator to the probe C, or more particularly the matching network D. Radio frequency signals generated by resonating dipoles in the image region are received by the coil and transmitted through the transmission line 22 to a radio frequency receiver means 24. The received magnetic resonance signals are conveyed to the magnetic resonance imager E where they are reconstructed by a two dimensional Fourier transform from an algorithm or the like into an image representation. In the embodiment illustrated in FIG. 1, the probe C is a saddle coil that has feed points 30 and 32 interconnected with the matching network D.

A first inductor means 40 is connected between the inductor pairs, hence across the first and second coil feed points 30, 32. As stated above, at frequencies above the self resonance frequency, the coil C appears to be capacitively reactive. The first inductor means is selected to have an inductive reactance which cancels the capacitive reactance across the feed points 30, 32 at a selected operating frequency, particularly above the self resonance frequency. That is, the inductive reactance of the first inductor means 40 cancels the imaginary portion of the impedance of the probe coil C at the selected resonance frequency.

With reference to FIG. 2, the matching network D includes an inductive pi network. A pair of parallel coils or inductors 42, 44 are connected each with one of the feed points 30, 32 of the probe coil C. The parallel connected inductor pair is selected of an appropriate size such that the difference between the inductance of the coil C and the combined inductance of the parallel inductors 42, 44 is equal to the characteristic resistive impedance of the radio frequency transmission line 22. In this manner, the combined resistive impedance of the coil and matching network matches the resistive impedance of the transmission line.

With reference to FIG. 3, the coil C may also be a Helmholz pair 50 which, again, has coil feed points 30, 32. A first inductor 40 is connected across the coil feed points to tune the probe coil. The inductive reactance of the first inductor is again selected such that the inductive reactance of the first inductor 40 cancels the capacitive reactance of the coil at a selected frequency above the self resonance point of the coil C. The transmission line 22 is interconnected at appropriate points midway along the first inductor such that an impedance match between the characteristic resistive impedance of the transmission line and the coil C match. In the embodiment of FIG. 3, the first inductor 40 is tapped symmetrically by the transmission line 22, i.e. balanced.

With reference to FIG. 4, the coil or NMR probe C is illustrated as a solenoid coil 60. The probe is be operated as a balanced to ground structure from an unbalanced source. The first inductor 40 is again connected across the coil feed points 30, 32 of the RF coil C. The transmission line 22 is connected in an unbalanced arrangement with the first inductor 40. Because the first inductor has mutual inductance with itself, it functions simultaneously as an impedance matching transformer, a balun, and a resonating reactance.

Figure 5:
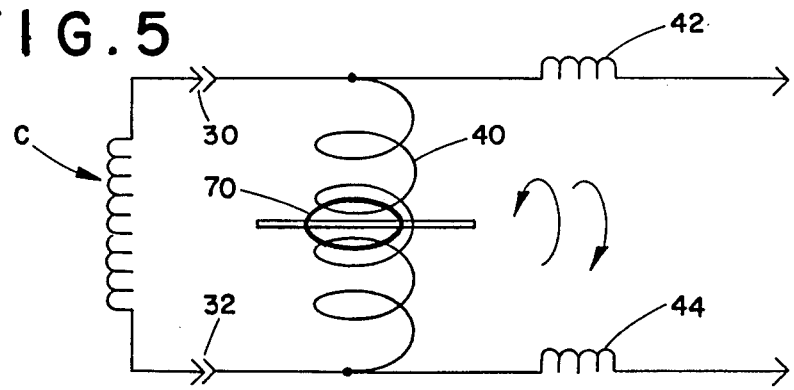
FIG. 5 is an alternate embodiment of a matching network with a variable inductance for operation above the self resonance frequency with series inductance.

With reference to FIG. 5, the RF coil or magnetic resonance probe C which again has coil feed points 30, 32. A first or resonating inductor 40 is again connected across the feed points. The first inductor is again selected to have an inductive reactance which cancels the imaginary or capacitive portion of the impedance of the coil C at the selected frequency above its self resonance point. A shorted turn 70 is rotatably mounted within the first inductor to adjust its inductance, hence the selected resonance frequency to be received or transmitted. Optionally, other techniques may also be utilized to adjust the inductance. The pair of parallel connected matching inductances 42, 44 again match the coil and matching network with the characteristic resistive impedance of the transmission line 22.

Figure 6:
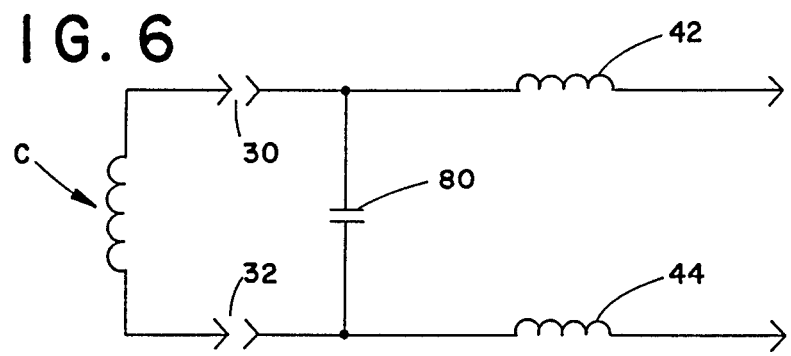
FIG. 6 is yet another alternate embodiment of the matching network for below the self resonance frequency with series inductors.

With reference to FIG. 6, inductive matching networks may also be utilized to resonate the coil C below its self resonance frequency. A pair of matching inductances 42, 44 match the inductance of the probe coil C with the resistive impedance of the RF transmission line 22. A first or resonating capacitance means 80 is connected across the coil feed points 30, 32. The capacitive reactance of the first capacitance 80 is selected such that it cancels the net inductive reactance of the probe coil at a selected frequency below the self resonance point.

Figure 7:
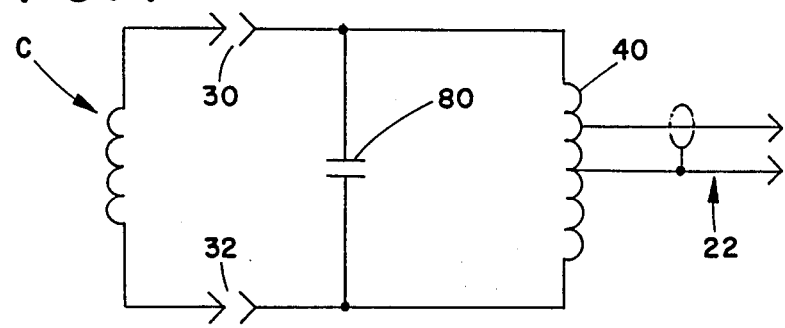
FIG. 7 is yet another alternate embodiment of a matching network for coils operating below self resonance with a tapped inductance as a balun; and, FIG. 8 is yet another alternate embodiment of the matching network with a variable inductance.

With reference to FIG. 7, the inductive matching network of the present invention may also be utilized as a balun and impedance matching network. A first or resonating capacitance 80 is connected across the probe coil feed points 30, 32. The resonating capacitance is again selected to cancel remaining inductive reactance of the probe coil when operating at a frequency below the self resonance point. A balun and impedance matching first inductor means 40 is also connected across the coil feed points 30, 32. The transmission line 22 is tapped to the impedance matching inductor 40. Although an unbalanced relationship is illustrated in FIG. 7, it is to be appreciated that the transmission line may be tapped to the coil in a balanced relationship.

Figure 8:
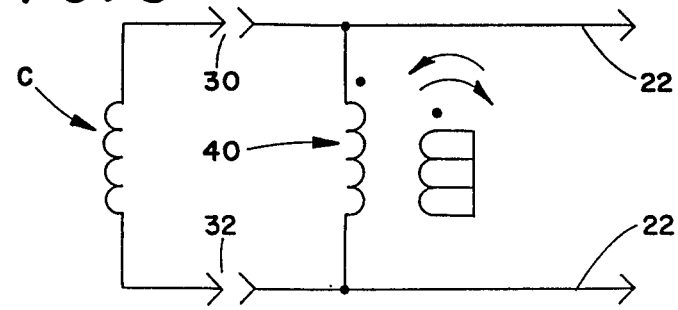

With reference to FIG. 8, the resonating inductor 40 may be arranged as part of a transformer coil arrangement in order to match network components.

The present invention has been described with reference to the preferred embodiments. Obviously, modifications and alterations will occur to others upon reading and understanding the preceding detailed description. For example, any of the described balanced networks may be utilized with any of the described coil configurations, as well as other coil configurations. Moreover, although the same coil may be used for both transmit and receive in the illustrated embodiment, separate transmit and receive coils may optionally be provided. Moreover, the matching networks may also be utilized in conjunction with quadrature coils. It is intended that the invention be construed as including all such alterations and modifications in so far as they come within the scope of the appended claims or the equivalent thereof.

Having thus described preferred embodiments, the invention is now claimed to be:

1. A magnetic resonance spectrometer comprising:
   a probe for at least receiving radio frequency magnetic resonance signals from a sample, the probe having a self resonance frequency above which the probe is capacitively reactive and below which the probe is inductively reactive;
   a magnetic field means for selectively generating a magnetic field adjacent the probe;
   a radio frequency transmission line for conveying the magnetic resonance signals from the probe to a radio frequency receiver means; and,
   an inductive matching network directly connecting the probe and the transmission line for matching reactive and resistive impedance of the probe with the resistive impedance of the transmission line, the matching network having a net inductive reactance at frequencies above the self resonance frequency, such that the probe is operable in a resonance mode at frequencies above the self resonance frequency.

2. The spectrometer as set forth in claim 1 further including an image reconstruction means for reconstructing an image representation from the received resonance signals.

3. A magnetic resonance spectrometer comprising:
   a probe for at least receiving radio frequency magnetic resonance signals from a sample, the probe having a self resonance frequency above which the probe is capacitively reactive and below which the probe is inductively reactive, the probe having feed points;
   a magnetic field means for selectively generating a magnetic field adjacent the probe;
   a radio frequency transmission line for conveying the magnetic resonance signals from the probe to a radio frequency receiver means; and,
   an inductive matching network operatively connected between the probe and the transmission line for matching reactive and resistive impedance of the probe with the resistive impedance of the transmission line, the matching network including a first inductor connected across the feed points of the probe for resonating the probe at a frequency in excess of the self resonance frequency.

4. The spectrometer as set forth in claim 3 wherein the transmission line is tapped to the first inductor.

5. A magnetic resonance spectrometer comprising:
   a probe for at least receiving radio frequency magnetic resonance signals from a sample, the probe having feed points at which the received signals can be monitored, the probe having a self resonance frequency above which the probe is capacitively reactive and below which the probe is inductively reactive;
   a magnetic field means for selectively generating a magnetic field adjacent the probe;
   a radio frequency transmission line for conveying the magnetic resonance signals from the probe to a radio frequency receiver means; and,
   a pair of matching inductors connected in parallel between probe feed points and the transmission line for matching the resistive impedances of the probe and the transmission line and for cancelling the capacitive reactance of the probe at frequencies above the self resonance frequency.

6. The spectrometer as set forth in claim 5 further including a first capacitor means connected between the probe feed points for resonating the probe at a frequency below the self resonance frequency.

7. The spectrometer as set forth in claim 1 wherein the matching network includes an adjustable reactance means connected between feed points of the probe coil.

8. A probe assembly for magnetic resonance spectrometers and the like, the probe assembly comprising:
   a probe coil having first and second feed points, the probe having a capacitive reactance above a self resonance frequency;

a transmission line for conveying magnetic resonance signals from the probe coil to a radio frequency receiver means; and, a first inductor means connected between the feed points for cancelling the capacitive reactance of the probe to resonate the probe coil at a frequency in excess of the self resonance frequency.

9. A magnetic resonance probe assembly for operation at frequencies other than a natural self resonance frequency thereof, the assembly comprising:

a probe coil having first and second feed points, the coil having a self resonance frequency above which it appears at the feed points to be capacitively reactive and below which it appears at the feed points to be inductively reactive; and, a matching network operatively connected with the first and second coil feed points, the matching network including a first reactance means which cancels an imaginary portion of the reactance of the coil and matching network at a preselected frequency other than the self resonance frequency.

10. The assembly as set forth in claim 9 wherein the first reactance means is connected across the first and second coil feed points.

11. The assembly as set forth in claim 10 wherein the first reactance means includes a first inductor which has an inductive reactance that cancels the capacitive reactance of the coil and wherein the preselected frequency is above the self resonance frequency.

12. The assembly as set forth in claim 10 further including a pair of matching inductors operatively connected with opposite ends of the first reactance means, the matching inductors being selected such that the difference between the inductance of the probe coil and the sum of the reactances of the matching inductors is equal to a characteristic resistive impedance of a radio frequency transmission line for connecting the inductive matching network with a radio frequency receiver.

13. The assembly as set forth in claim 12 wherein the preselected frequency is below the self resonance frequency and wherein the first reactance means includes a capacitor means having a capacitive reactance which cancels the imaginary portion of the reactance of the coil at the selected frequency.

14. The assembly as set forth in claim 10 wherein the first reactance means includes a first inductor connected between the coil feed points and further including a radio frequency transmission line tapped into the first inductor.

15. The assembly as set forth in claim 14 wherein the transmission line is tapped in an unbalanced arrangement with the first inductor.

16. The assembly as set forth in claim 10 wherein the first reactance means is adjustable for selectively tuning the matching network to the preselected frequency.

17. The assembly as set forth in claim 10 wherein the probe coil includes one of a saddle coil, a Helmholz coil pair, and a solenoid coil.

18. A method of receiving magnetic resonance signals at a magnetic resonance frequency above a self resonance frequency of a receiving coil, the method comprising:

positioning a receiving coil having a self resonance frequency above which the coil is capacitively reactive in a magnetic field to receive signals at the magnetic resonance frequency from a subject therein;

connecting an inductive reactance across the coil, which inductive reactance cancels the capacitive reactance of the coil at the magnetic resonance frequency; and, operating the probe in a resonant manner above the self resonance frequency at the magnetic resonance frequency by cancelling the capacitive reactance of the probe with the inductive reactance.

19. The method as set forth in claim 18 further including the step of adjusting the inductive reactance to tune the coil to the magnetic resonance frequency.

* * * * *